(12) United States Patent  
Kawadahara

(10) Patent No.: US 10,510,569 B2  
(45) Date of Patent: Dec. 17, 2019

(54) PATTERN FORMING APPARATUS AND MANUFACTURING METHOD FOR SEMICONDUCTOR DEVICE

(71) Applicant: Toshiba Memory Corporation, Minato-ku (JP)

(72) Inventor: Sho Kawadahara, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/039,856

(22) Filed: Jul. 19, 2018

(65) Prior Publication Data

US 2019/0221461 A1 Jul. 18, 2019

(30) Foreign Application Priority Data

Jan. 16, 2018 (JP) ................................. 2018-005051

(51) Int. Cl.
*H01L 21/67* (2006.01)
*H01L 21/60* (2006.01)

(52) U.S. Cl.
CPC .. *H01L 21/67282* (2013.01); *H01L 21/67253* (2013.01); *H01L 21/67288* (2013.01); *H01L 2021/60075* (2013.01)

(58) Field of Classification Search
CPC ......... H01L 21/67282; H01L 21/67253; H01L 21/67288; H01L 2021/60075
See application file for complete search history.

(56) References Cited

U.S. PATENT DOCUMENTS

| | | | | |
|---|---|---|---|---|
| 7,009,683 B2* | 3/2006 | Sato | ...................... | G03B 27/42 250/492.2 |
| 2013/0135458 A1* | 5/2013 | Taniguchi | ........... | B41F 33/0081 348/95 |
| 2013/0308109 A1* | 11/2013 | Arai | .................... | G03F 7/70775 355/30 |
| 2017/0287750 A1* | 10/2017 | Amano | ............. | H01L 21/67253 |

FOREIGN PATENT DOCUMENTS

| | | |
|---|---|---|
| JP | 63-202019 | 8/1988 |
| JP | 11-87222 | 3/1999 |
| JP | 2011-108691 | 6/2011 |

* cited by examiner

*Primary Examiner* — Zandra V Smith  
*Assistant Examiner* — Andre C Stevenson  
(74) *Attorney, Agent, or Firm* — Oblon, McClelland, Maier & Neustadt, L.L.P.

(57) ABSTRACT

A pattern forming apparatus according to an embodiment includes: a pre-alignment unit that performs pre-alignment for a substrate; a transfer unit that transfers the substrate into the pre-alignment unit; a placing table on which the substrate transferred into the pre-alignment unit is placed; a position detecting unit provided at a position included in the placing table and overlapping with an edge of the substrate, and adapted to detect a position of the edge of the substrate; and a control unit that calculates a positional displacement amount of the substrate from the position of the edge of the substrate detected by the position detecting unit, and controls the placing table on the basis of the positional displacement amount of the substrate to correct the position of the substrate.

20 Claims, 11 Drawing Sheets

FIG.3
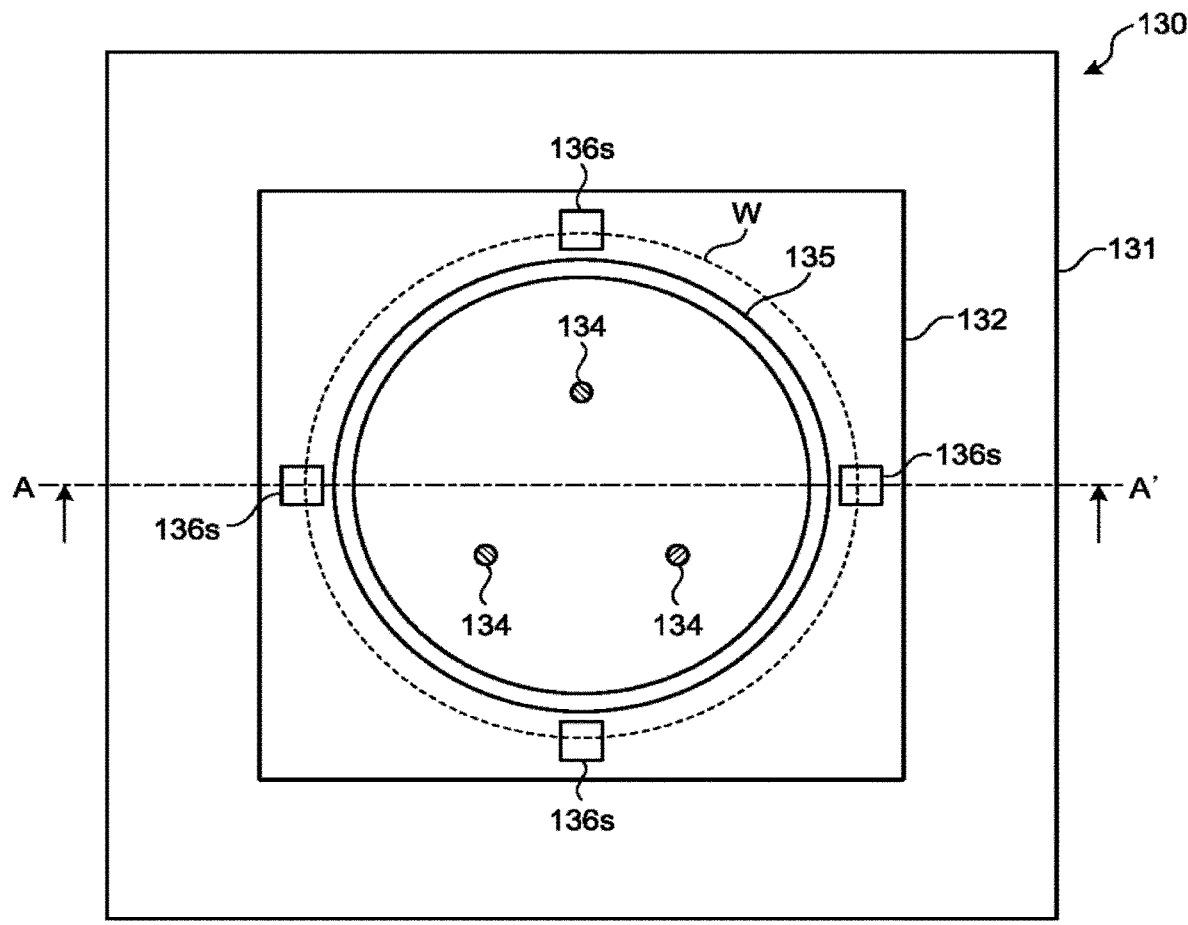
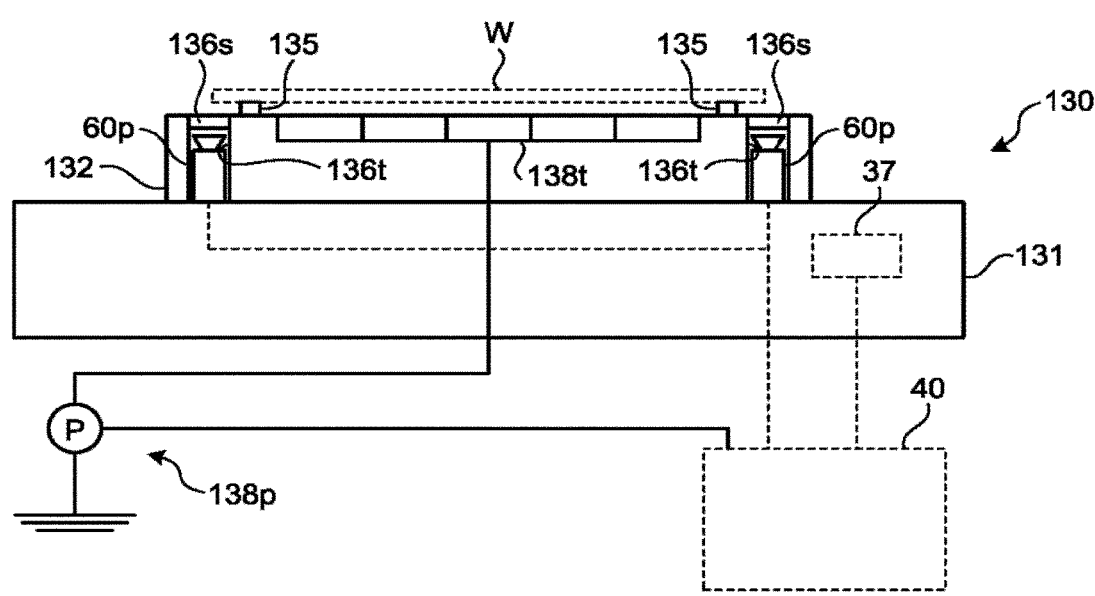

FIG.7
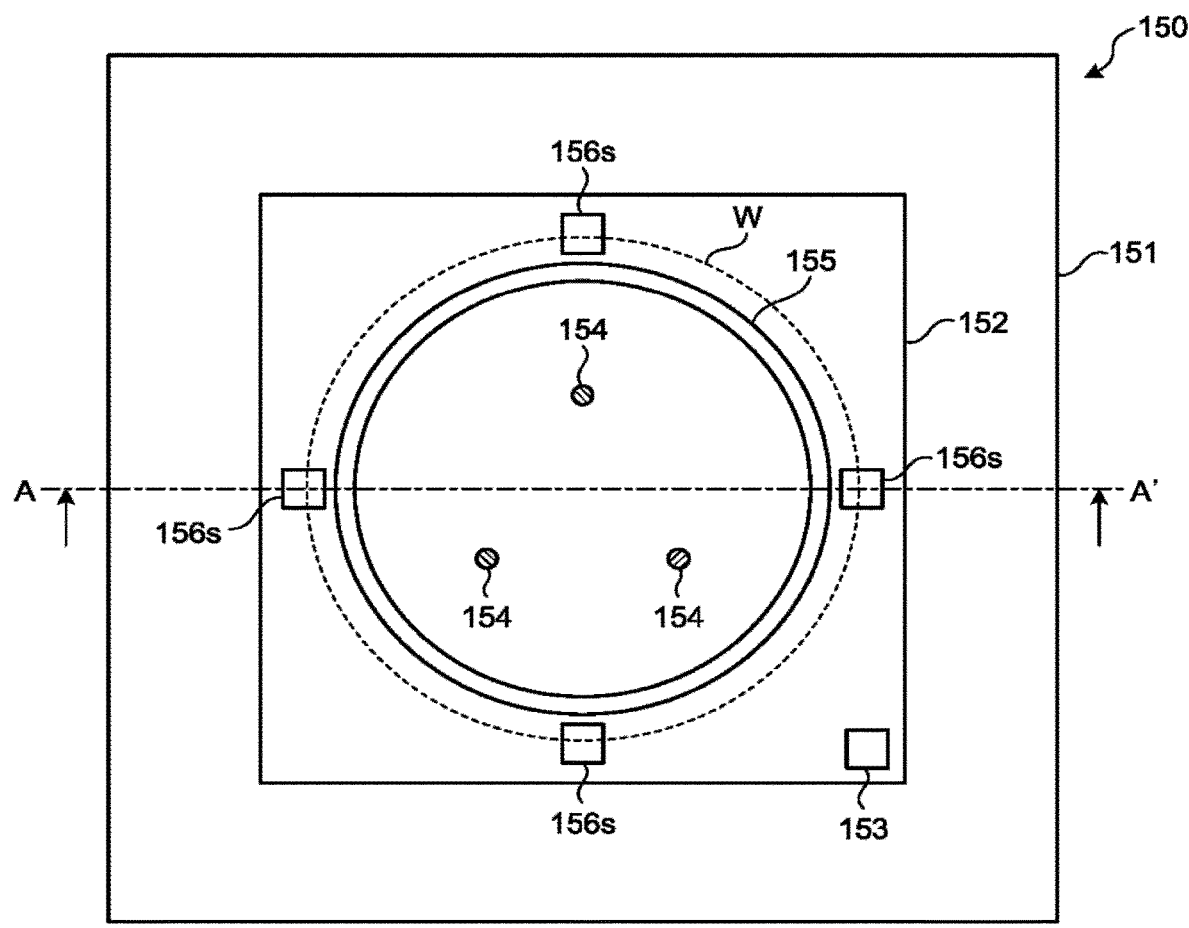
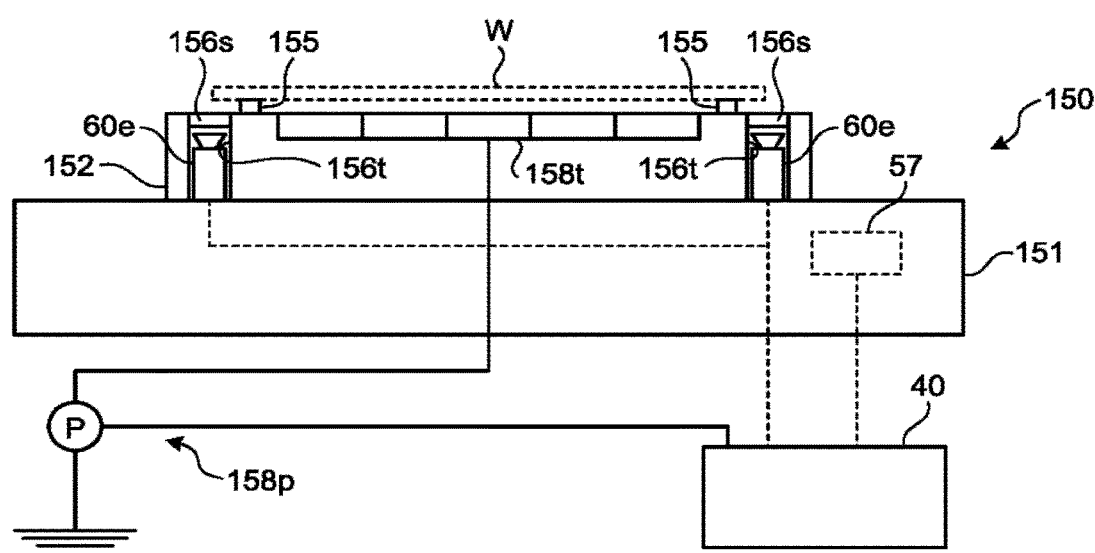

PATTERN FORMING APPARATUS AND MANUFACTURING METHOD FOR SEMICONDUCTOR DEVICE

CROSS-REFERENCE TO RELATED APPLICATIONS

This application is based upon and claims the benefit of priority front Japanese patent application No. 2018-005051, filed on Jan. 16, 2018; the entire content of which are incorporated herein by reference.

FIELD

Embodiments of the present invention described herein relate generally to a pattern forming apparatus and a manufacturing method for a semiconductor device.

BACKGROUND

There is a process of forming a pattern on a substrate as one of manufacturing processes for a semiconductor device. In the pattern forming process, a substrate is transferred into a processing unit of a pattern forming apparatus, and a pattern is formed on the substrate by using a master.

Meanwhile, in the prior art, there may be a case where time is required for substrate alignment inside a pattern forming apparatus.

BRIEF DESCRIPTION OF THE DRAWINGS

FIG. 3 is an exemplary detailed structure of a placing table of the P/A unit according to the embodiment;

FIG. 7 is an exemplary detailed configuration of the placing table of the exposure unit according to the embodiment;

DETAILED DESCRIPTION

A pattern forming apparatus according to an embodiment includes: a processing unit that applies processing to a substrate; a transfer unit that transfers the substrate into the processing unit; a placing table on which the substrate transferred into the processing unit is placed; a position detecting unit provided at a position included in the placing table and overlapping with an edge of the substrate, and adapted to detect a position of the edge of the substrate; and a control unit which calculates a positional displacement amount of the substrate from the position of the edge of the substrate detected by the position detecting unit, and controls the placing table on the basis of the positional displacement amount of the substrate to correct the position of the substrate.

Hereinafter, the present invention will be described in detail with reference to the drawings. Note that the present invention is not limited to the following embodiments. Additionally, constituent elements in the following embodiments include those easily conceivable by a man skilled in the art or those substantially identical.

Embodiment

A pattern forming apparatus according to an embodiment is, for example, an exposure apparatus that forms a pattern by exposing resist applied to a wafer. The exposure apparatus according to the embodiment and modified examples thereof will be described with reference to FIGS. 1 to 13.

Exemplary Configuration of Exposure Apparatus

Figure 1:
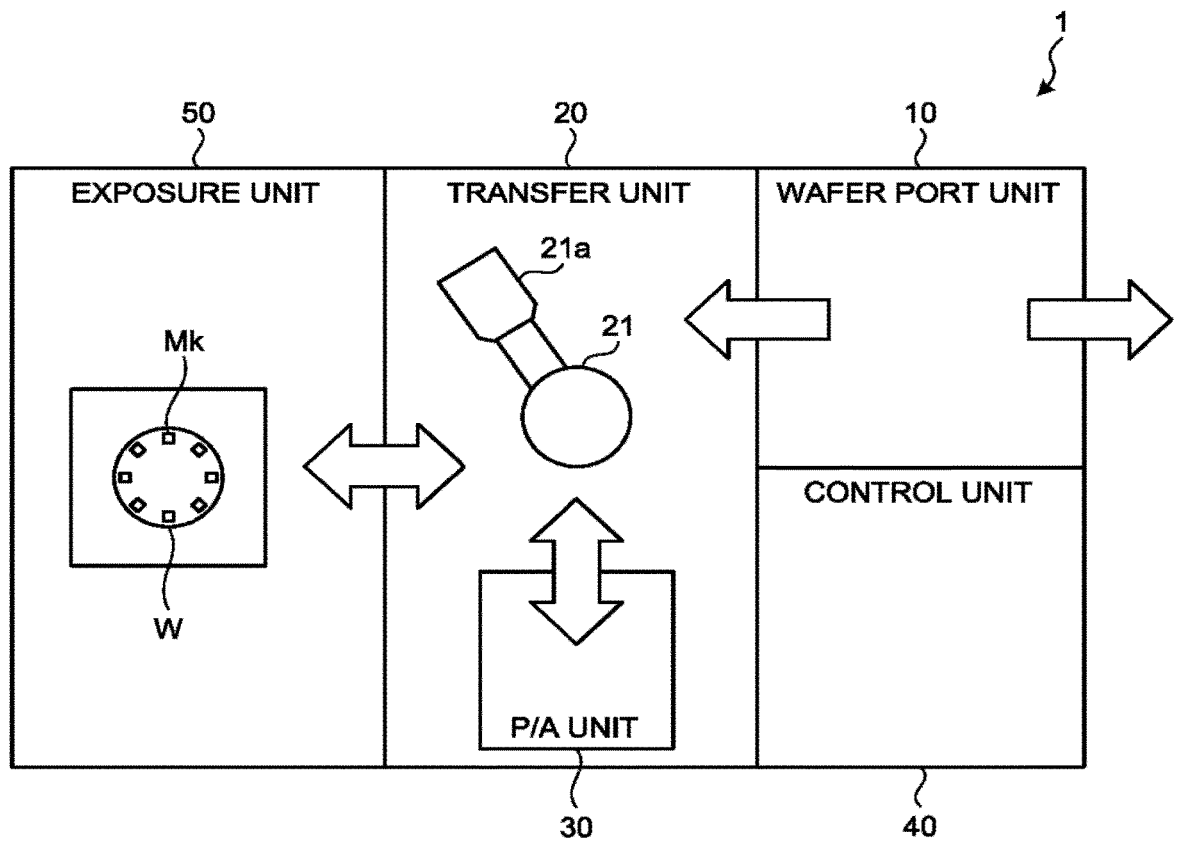
FIG. 1 is a diagram illustrating an entire configuration of an exposure apparatus according to an embodiment.

FIG. 1 is a diagram illustrating an entire configuration of an exposure apparatus 1 according to an embodiment. As illustrated in FIG. 1, the exposure apparatus 1 includes a wafer port unit 10, a transfer unit 20, a pre-alignment (P/A) unit 30 serving as a processing unit, an exposure unit 50 serving as another processing unit, and a control unit 40. Arrows in the drawing represent transfer directions of a wafer W.

The wafer port unit 10 transfers a wafer W to the inside/outside of the exposure apparatus 1. Specifically, a wafer cassette or a wafer pod (not illustrated) is placed on the wafer port unit 10. The wafer W is transferred into the exposure apparatus 1 from the wafer cassette or the wafer pod, and the wafer W is transferred out to the wafer cassette or wafer pod from the inside of the exposure apparatus 1.

In the wafer port unit 10, a transfer unit 20 is provided adjacent thereto. A transfer robot 21 is installed inside the transfer unit 20. The transfer robot 21 includes a transfer arm 21a, and transfers the wafer W between the transfer unit 20 and each of the wafer port unit 10, the P/A unit 30, and the exposure unit 50.

The P/A unit 30 is also installed inside the transfer unit 20. A wafer W is transferred into the P/A unit 30 from the wafer port unit 10 through the transfer unit 20. The P/A unit 30 performs TV pre-alignment for the transferred wafer W. TV pre-alignment is, for example, rough alignment using a TV monitor screen. In the TV pre-alignment, alignment (positioning) of the wafer W is performed with reference to a plurality of marks Mk provided on the wafer W. The TV pre-alignment is preliminary alignment for precise fine alignment performed inside the exposure unit 50 described later. A detailed configuration of the P/A unit 30 will be described later.

The exposure unit 50 is provided adjacent to the transfer unit 20 on an opposite side of the wafer port unit 10. A wafer W is transferred into the exposure unit 50 from the P/A unit 30 through the transfer unit 20. First, fine alignment is performed for the transferred wafer W. In the fine alignment, alignment for the wafer W is performed with reference to the plurality of marks Mk provided on the wafer W. The fine alignment is performed with reference to the more number of marks Mk compared to that in TV pre-alignment. The exposure unit 50 emits exposure light to resist not illustrated and located on the wafer W through a reticle serving as a master, thereby transferring a pattern to the resist. A detailed configuration of the exposure unit 50 will be described later. The wafer W processed in the exposure unit 50 is transferred to the outside of the exposure apparatus 1 from the transfer unit 20 through the wafer port unit 10.

The control unit 40 is formed as, for example, a computer including a hardware processor like a central processing unit (CPU), a memory, a hard disk drive (HDD), and the like. The control unit 40 controls respective units of the wafer port unit 10, respective units of the transfer robot 21 and the P/A unit 30 of the transfer unit 20, and respective units of the exposure unit 50.

Exemplary Configuration of P/A Unit

Figure 2:
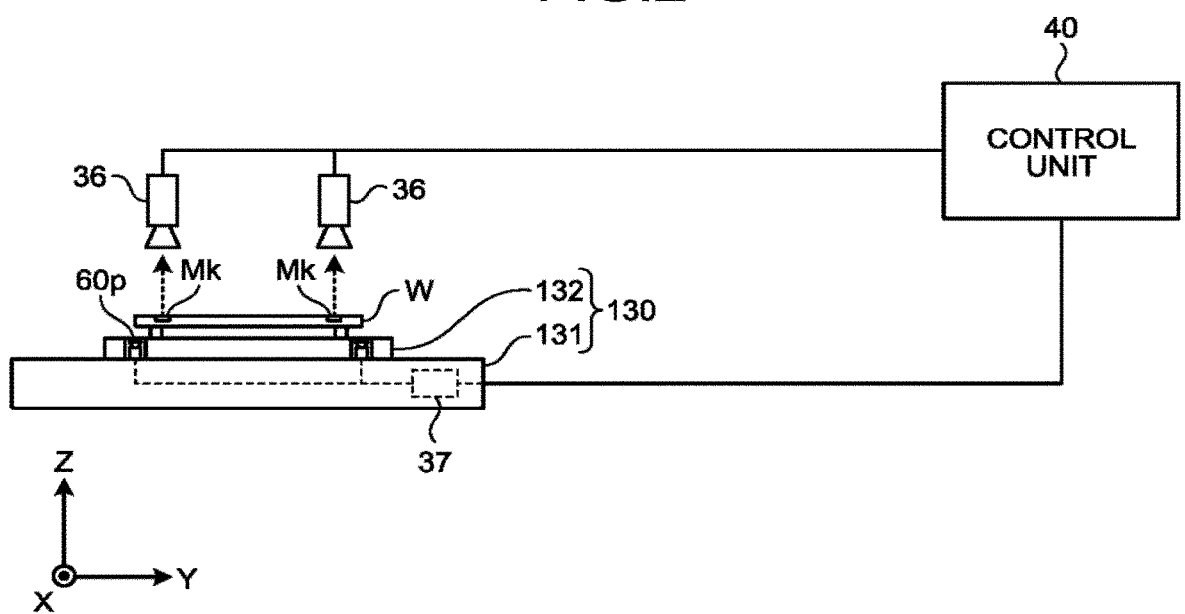
FIG. 2 is a diagram illustrating an exemplary configuration of a P/A unit of the exposure apparatus according to the embodiment.

Next, the detailed configuration of the P/A unit 30 will be described with reference to FIG. 2. FIG. 2 is a diagram illustrating an exemplary configuration of the P/A unit 30 of the exposure apparatus 1 according to the embodiment. In FIG. 2, a direction extending toward a near side on a perpendicular line of the drawing paper will be referred to as an X axis direction, a direction toward a right side of the drawing paper will be referred to as a Y axis direction, and a direction toward an upper side of the drawing paper will be referred to as the Z axis direction. The X axis, the Y axis, and the Z axis are orthogonal to each other.

As illustrated in FIG. 2, the P/A unit 30 includes a mark detecting unit 36, a driving device 37, a placing table 130, and a position detecting unit 60p. These units are controlled by the control unit 40.

The placing table 130 includes a main body 131 and a wafer chuck 132, and movably supports a wafer W. The driving device 37 includes a motor (not illustrated), and moves the placing table 130 in the X axis direction, Y axis direction, and Z axis direction.

The wafer chuck 132 of the placing table 130 is provided with the position detecting unit 60p. The position detecting unit 60p detects an edge position of the wafer W and transmits positional information thereof to the control unit 40.

The plurality of mark detecting units 36 detects marks Mk provided on the wafer W and performs TV pre-alignment for the wafer W. The mark detecting unit 36 is, for example, an imaging element such as a CCD or a CMOS sensor. The plurality of imaging elements detects positional information and the like of respective corresponding marks Mk, and the detected positional information and the like are transmitted to the control unit 40.

The control unit 40 adjusts, for example, the position of the placing table 130 in accordance with the positional information of the edge of the wafer W detected by the position detecting unit 60p. The control unit 40 also adjusts a position of the placing table 130 in accordance with the positional information and the like of each mark Mk detected by the mark detecting unit 36.

The position detecting unit 60p and the mark detecting unit 36 will be further described with reference to FIGS. 3 to 5.

First, a detailed configuration of the position detecting unit 60p will be described with reference to FIG. 3. FIG. 3 is an exemplary detailed structure of the placing table 130 of the P/A unit 30 according to the embodiment. An upper part of FIG. 3 is a plan view of the placing table 130, and a lower part thereof is a cross-sectional view of the placing table 130 taken along A-A'.

As illustrated in FIG. 3, the wafer chuck 132 is formed as a chuck including a pump device 138p and a suction pipe 138t. A center of the wafer chuck 132 is provided with a plurality of pin holes 134 through which pins (not illustrated) used to transfer a wafer W is pushed up. Additionally, a suction hank 135 is provided in a ring shape on a slightly inner side of the position where the wafer W is placed. For example, four through holes 136t are provided in a manner surrounding the suction bank 135 at positions located an outer side of the suction bank 135 and overlapping with an edge of the placed wafer W. Each of the through holes 136t is covered with a quartz window 136s and formed flat against a surface of the wafer chuck 132.

A position detecting unit 60p is provided inside each of the through holes 136t. Each of the position detecting units 60p is an imaging element such as a CCD or a CMOS sensor. For example, the imaging element of each position detecting unit 60p has an imaging range wider than an imaging element of the mark detecting unit 36, and can detect an edge of a wafer W placed on the wafer chuck 132. The imaging element of each position detecting unit 60p has a field of view of, for example, 200 μm square or more and 800 μm square or less. For example, each position detecting unit 60p is operated during a period from when a wafer W is transferred into the P/A unit 30 until the wafer W is transferred out from the P/A unit 30, and detects an edge of the wafer W.

The control unit 40 controls the pump device 138p of the wafer chuck 132, the driving device 37, and each position detecting unit 60p. Additionally, the control unit 40 receives, from each position detecting unit 60p, positional information of a wafer W and feeds the same back to the driving device 37 of the placing table 130.

A function of a position detecting unit 60p will be described in more detail with reference to FIG. 4.

Figure 4:
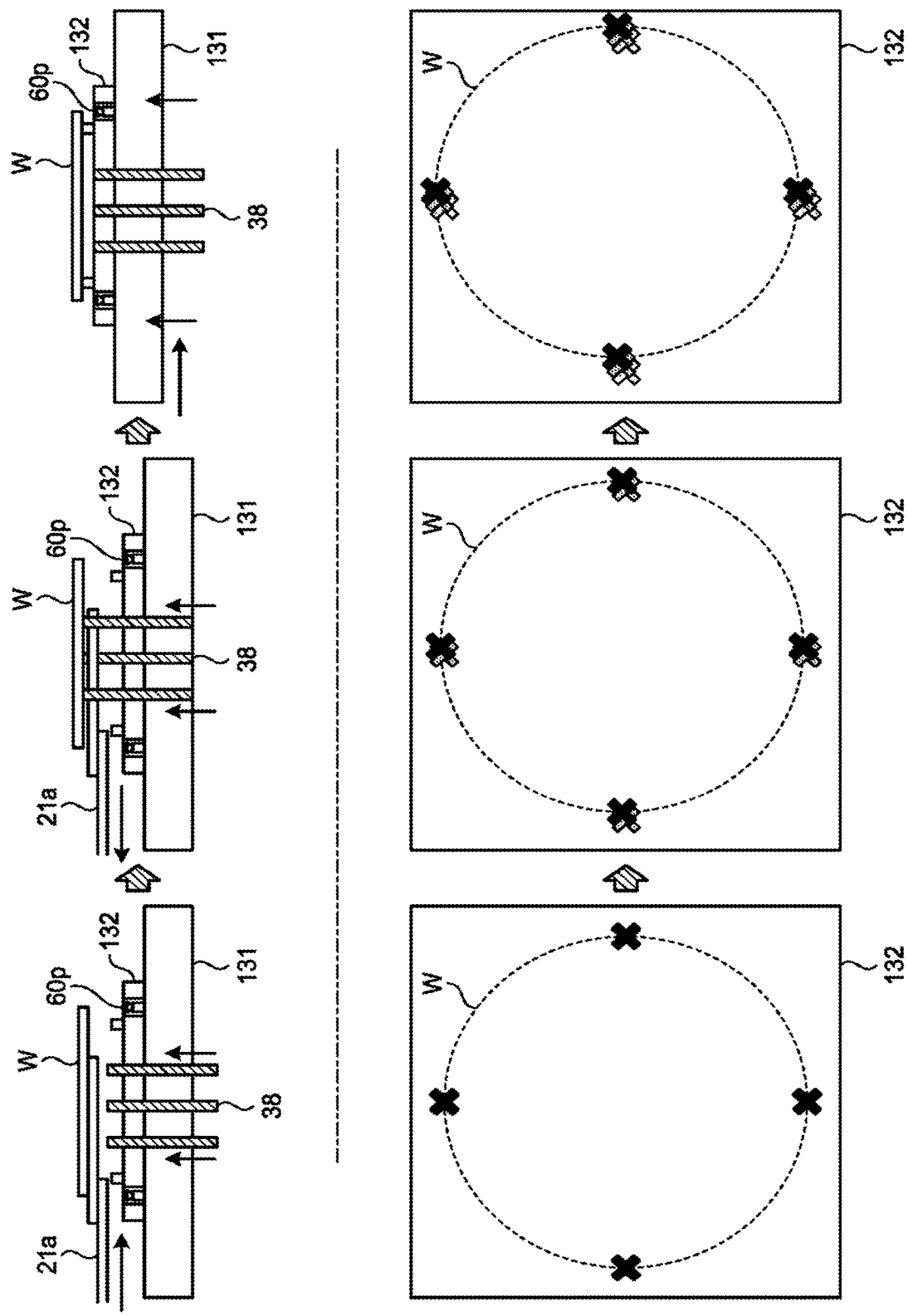
FIG. 4 is a diagram illustrating transfer operation from when a wafer is transferred into the P/A unit until the wafer placed on a wafer chuck.

FIG. 4 is a diagram illustrating transfer operation from when a wafer W is transferred into the P/A unit 30 until the wafer W is placed on a wafer chuck 132. First, details of the transfer operation will be described with reference to an upper part of FIG. 4. The upper part of FIG. 4 is a schematic diagram of wafer W transfer operation by the transfer robot 21.

As illustrated in the upper part of FIG. 4, the transfer arm 21a of the transfer robot 21 transfers a wafer W above the wafer chuck 132 located at a transfer position of the P/A unit 30. Furthermore, a plurality of pins 38 housed under the wafer chuck 132 start push-up operation. Due to such push-up operation, the wafer W on the transfer arm 21a is pushed up by the pins 38 and supported by the pins 38. Next, when the transfer arm 21a returns to the transfer unit 20 and the wafer chuck 132 is moved parallel to an alignment position and further moved upward, the wafer W is placed on the wafer chuck 132.

While the wafer W is transferred from the wafer port unit 10 to the P/A unit 30 or when the wafer W is placed on the wafer chuck 132, about several µm positional displacement (lateral displacement) of the wafer W may be caused. During transfer operation of the wafer W to the P/A unit 30, each position detecting unit 60p detects an edge of the wafer W and transmits positional information thereof to the control unit 40. The control unit 40 determines occurrence of positional displacement on the basis of the positional information. In the following description, it is assumed that positional displacement of the wafer W is caused when the wafer W is placed on the wafer chuck 132.

The lower part of FIG. 4 illustrates a state in which each position detecting unit 60p detects an edge of the wafer W. When the wafer W is transferred above the wafer chuck 132, each position detecting unit 60p detects an edge of the wafer W as illustrated in the lower part of FIG. 4. At this point, when the wafer W is laterally displaced due to contact with the wafer chuck 132 or the like, each position detecting unit 60p monitors such movement of an edge of the wafer W. In other words, the imaging element of each position detecting unit 60p images an edge of the wafer W at predetermined intervals. In the lower part of FIG. 4, movement of edges of the wafer W which are gradually laterally displaced are represented by x marks.

The positional information of each edge of the wafer W monitored by each position detecting unit 60p is transmitted to the control unit 40. The control unit 40 calculates a positional displacement amount of the wafer W on the basis of such positional information on the wafer W and determines whether positional displacement of the wafer W is caused or whether the positional displacement amount is within a predetermined threshold value in the case positional displacement of the wafer W is caused. The positional displacement amount is calculated, for example, as a vector changed amount indicating a displaced direction and a displaced sire of the wafer W. In a case where the positional displacement amount is within the threshold value, the control unit 40 controls the driving device 37 to move the placing table 130 so as to correct the positional displacement of the wafer W. When the positional displacement amount exceeds the threshold value, the control unit 40 redoes transfer of the wafer W to the P/A 30 unit or executes forced termination due to an error.

A function of the mark detecting unit 36 will be described in detail with reference to FIG. 5.

Figure 5:
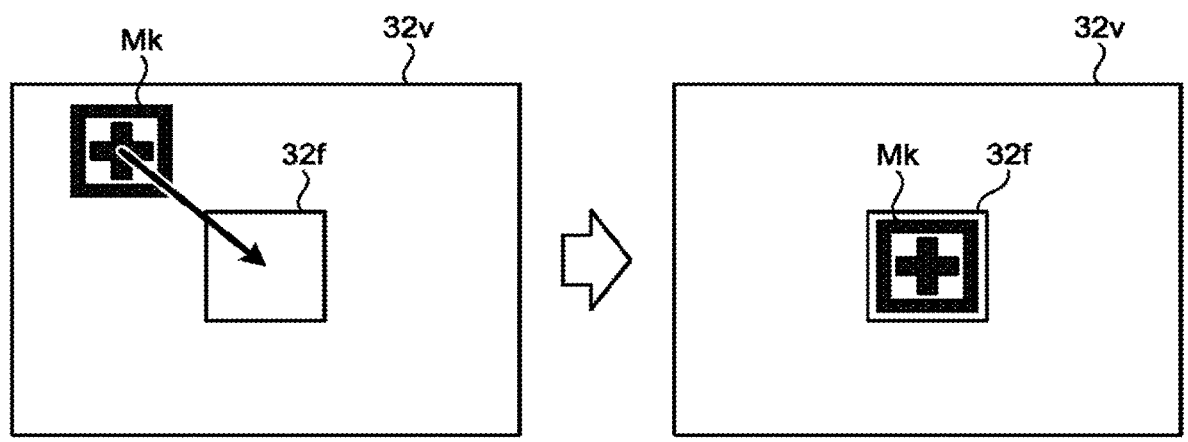
FIG. 5 is a diagram illustrating state in which a mark detecting unit executes TV pre-alignment according to the embodiment.

FIG. 5 is a diagram illustrating a state in which a mark detecting unit 36 executes TV pre-alignment according to the embodiment; As illustrated in FIG. 5, for example, a mark Mk having a cross shape surrounded by a rectangular frame is captured in a field of view 32v of, for example, 200 µm square of the mark detecting unit 36. The control unit 40 controls the driving device 37 to move the placing table 130 such that the mark Mk fits inside a central frame 32f within the field of view 32v the mark detecting unit 36. A position of the placing table 130 at this moment is recorded in, for example, a storage unit (not illustrated) inside the control unit 40, and is reflected on a transfer position when a wafer W is transferred into the exposure unit 50.

Exemplary Configuration of Exposure Unit

Figure 6:
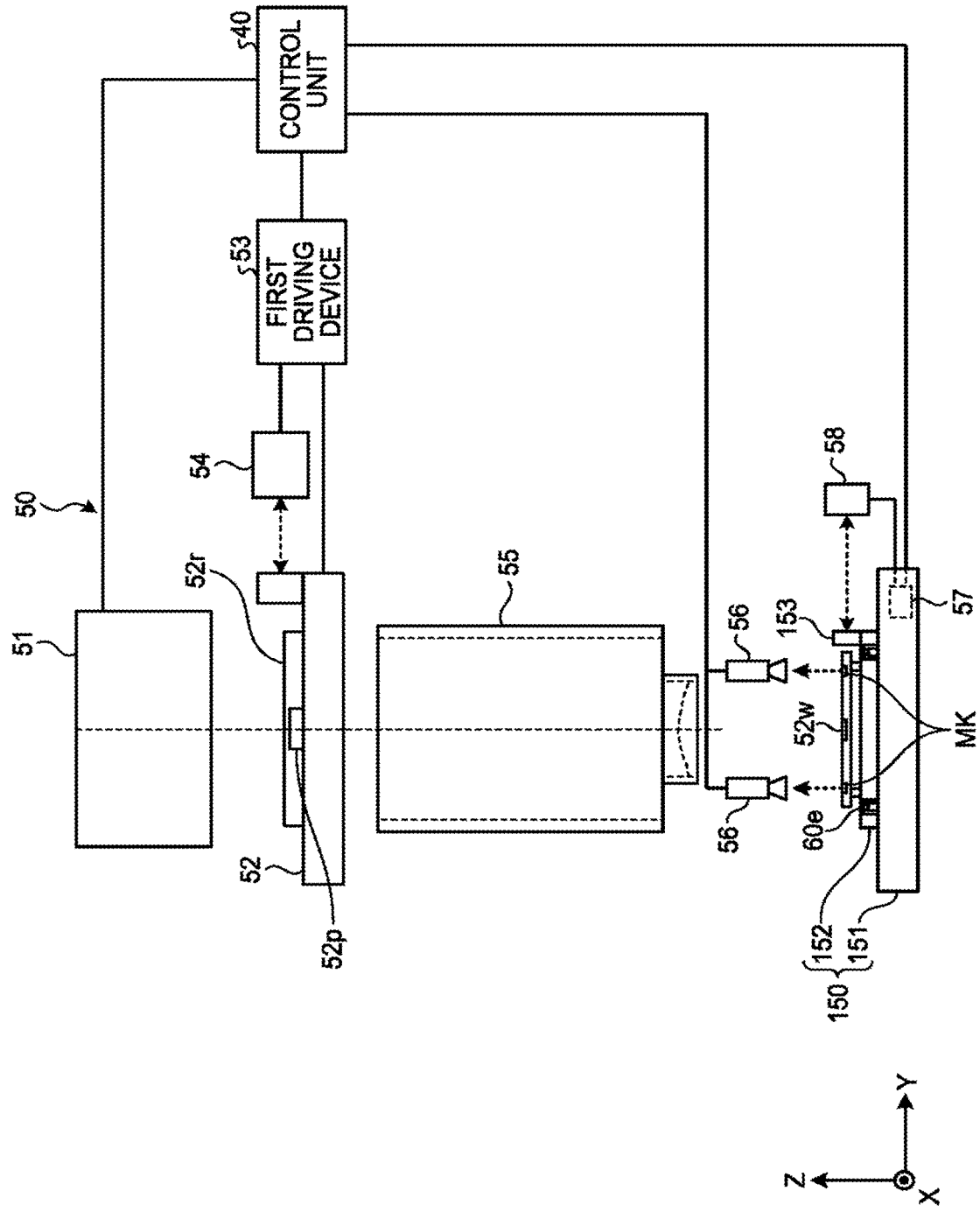
FIG. 6 is a diagram illustrating an exemplary configuration of an exposure unit of the exposure apparatus according to the embodiment.

Next, a detailed configuration of the exposure unit 50 will be described with reference to FIG. 6. FIG. 6 is a diagram illustrating an exemplary configuration of the exposure unit 50 of the exposure apparatus 1 according to the embodiment. In FIG. 6, a direction extending toward a near side on a perpendicular line of the drawing paper will be referred to as an X axis direction, a direction toward a right side of the drawing paper will be referred to as a Y axis direction, and a direction toward an upper side of the drawing paper will be referred to as the Z axis direction. The X axis, the Y axis, and the Z axis are orthogonal to each other.

As illustrated in FIG. 6, the exposure unit 50 includes an illumination unit 51, a reticle stage 52, a first driving device 53, a first interferometer 54, a projection unit 55, a mark detecting unit 56, a second driving device 57, a second interferometer 58, a placing table 150, and a position detecting unit 60e. These units are controlled by the control unit 40.

The placing table 150 includes a main body 151 and a wafer chuck 152, and movably supports a wafer W. The second driving device 57 includes a motor (not illustrated), and moves the placing table 150 in the X axis direction, Y axis direction, and Z axis direction. A position of the placing table 150 is measured by the second interferometer 58 while using a reference mark 153 provided on the placing table 150, and a measurement result is fed to the second driving device 57. The second driving device 57 controls the position of the placing table 150 by using the measurement result of the second interferometer 58. The wafer W is moved together with movement of the placing table 150.

A positron detecting unit 60e is provided on the wafer chuck 152 of the placing table 150. The position detecting unit 60e detects a position of an edge of the wafer W and transmits positional information to the control unit 40. A detailed configuration of the position detecting unit 60e will be described later.

The mark detecting unit 56 detects a mark Mk provided on the wafer W and transmits positional information and the like to the control unit 40. The control unit 40 performs alignment for the wafer W in accordance with the positional information and the like. The mark detecting unit 56 is, for example, an imaging element such as a CCD or CMOS sensor. The imaging element of the mark detecting unit 56 has a narrow field of view (e.g., 200 µm square) similar to the imaging element of the mark detecting unit 36, for example. A plurality of imaging elements detects corresponding marks Mk, the position of the placing table 150 is adjusted by the control unit 40 in accordance with the detected positions of the marks Mk, and the position of the wafer W is aligned with respect to the illumination unit 51. Alignment here is a high-precision fine alignment performed by detecting the more number of marks Mk than in TV pre-alignment.

The reticle stage 52 supports a reticle 52r having a region 52p in which a circuit pattern is drawn. The first driving device 53 includes a motor (not illustrated), and moves the reticle stage 52 at least on an XY plane. A position of the reticle stage 52 is measured by the first interferometer 54, and a measurement result is fed to the first driving device 53. The first driving device 53 controls the position of the reticle stage 52 on the basis of the measurement result obtained by the first interferometer 54. The reticle 52r is moved together with movement of the reticle stage 52.

The illumination unit 51 irradiates a range of the region 52p on the reticle 52r with exposure light. The projection unit 55 projects the exposure light having transmitted through the reticle 52r onto a region 52w of a resist (not illustrated) on a wafer W. With this projection, the circuit pattern drawn on the reticle 52r is transferred to the wafer W.

In the following, the position detecting unit 60e and the mark detecting unit 56 will be further described below.

First, a detailed configuration of the position detecting unit 60e will be described with reference to FIG. 7. FIG. 7 is an exemplary detailed configuration of the placing table 150 of the exposure unit 50 according to the embodiment. An upper part of FIG. 7 is a plan view of the placing table 150, and a lower part thereof is a cross-sectional view of the placing table 150 taken along A-A'. As illustrated in FIG. 7, the placing table 150 and the position detecting unit 60e of the exposure unit 50 have a structure substantially similar to the placing table 130 and a position detecting unit 60p of the P/A unit 30.

In other words, the wafer chuck 152 of the placing table 150 includes a pump device 158p and a suction pipe 158t. The wafer chuck 152 is provided with a plurality of pin holes 154, a ring-shaped suction bank 155, and four through holes 156t surrounding the suction bank 155 and each thereof is covered with a quartz window 156s.

For example, a position detecting unit 60e serving as an imaging element such as a CCD or a CMOS sensor is provided inside each of the through holes 156t. The imaging element of each position detecting unit 60e has a field of view of, for example, 200 μm square or more and 800 μm square or less. Each position detecting unit 60e is operated at least from when a wafer W is transferred into the exposure unit 50 until exposure processing for the wafer W is finished, thereby detecting an edge of the wafer W.

Thus, it is possible to detect, by using each of position detecting units 60e inside the exposure unit 50, positional displacement of the wafer W caused when the wafer W is transferred into the exposure unit 50 and during exposure processing.

The control unit 40 controls the wafer chuck 152 and each position detecting unit 60e. Additionally, the control unit 40 receives positional information of the wafer W from each position detecting unit 60e and feeds the received information back to the second driving device 57.

Transfer operation when a wafer W is placed on the wafer chuck 152 inside the exposure unit 50 is similar to transfer operation when a wafer W is placed on the wafer chuck 132 inside the P/A unit 30. Also, detecting operation for the edge of a wafer W by each position detecting unit 60e at the time of transferring the wafer W is similar to detecting operation for an edge of a wafer W by each position detecting unit 60p inside the P/A unit 30. Additionally, detecting operation of a mark Mk by the mark detecting unit 56 inside the exposure unit 50 is similar to detecting operation of a mark Mk by the mark detecting unit 36 inside the P/A unit 30. The mark detecting unit 56 differs from the mark detecting unit 36 in detecting the more number of marks Mk.

Exemplary Processing in Exposure Apparatus

Next, exemplary processing in the exposure apparatus 1 will be described with reference to FIGS. 8 and 9. The processing in the exposure apparatus 1 includes: TV pre-alignment in the P/A unit 30 as one processing of manufacturing processing for a semiconductor device; and exposure processing in the exposure unit 50 as another processing of the manufacturing processing for a semiconductor device.

First, exemplary processing of TV pre-alignment will be described with reference to FIG. 8.

Figure 8:
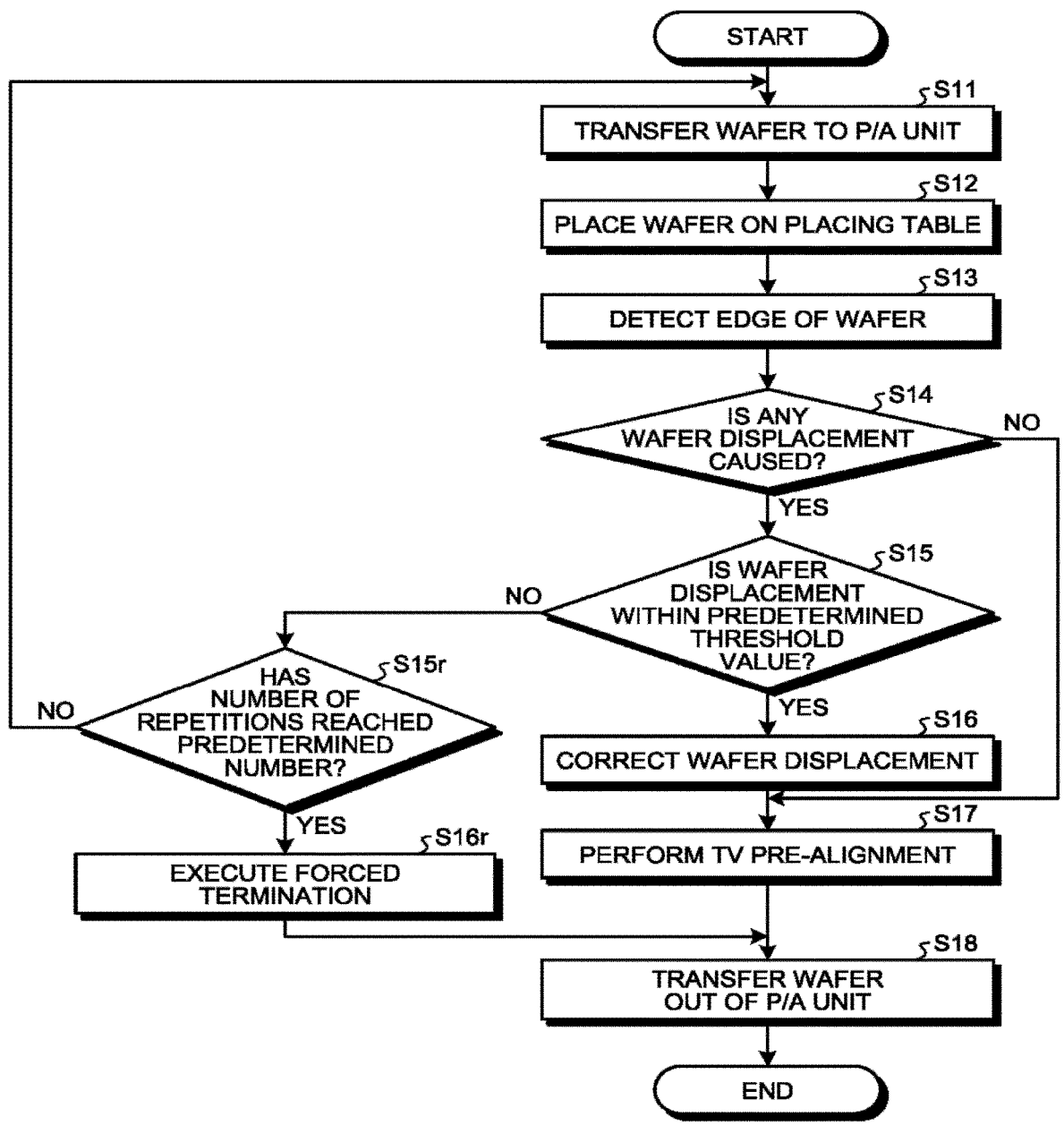
FIG. 8 is a flowchart illustrating exemplary procedures of TV pre-alignment in the exposure apparatus according to the embodiment.

FIG. 8 is a flowchart illustrating exemplary procedures of the TV pre-alignment in the exposure apparatus 1 according to the embodiment. In the flowchart of FIG. 8, for example, the control unit 40 operates the position detecting unit 60p from start of the processing in step S11 to end of the processing in step S18.

As illustrated in FIG. 8, in step S11, the control unit 40 transfers a wafer W into the P/A unit 30 by the transfer robot 21. In step S12, the control unit 40 places the wafer W on the placing table 130 by the transfer robot 21, the pins 38, and the like.

In step S13, the control unit 40 refers to data of each position detecting unit 60p during a period from when transfer of the wafer W into the P/A unit 30 is started by the transfer robot 21 until the wafer W is placed on the placing table 130. In step S14, the control unit 40 calculates a positional displacement amount from the referred data of each position detecting unit 60p, and determines whether positional displacement of the wafer W is caused during this period. When no positional displacement is caused (No), the processing proceeds to step S17. When positional displacement is caused (Yes), the control unit 40 determines in step S15 whether the positional displacement amount is within a predetermined threshold value.

When the positional displacement amount is within the threshold value in step S15 (Yes), the control unit 40 corrects, by the driving device 37 of the placing table 130, a position of the wafer W by the positional displacement amount in step S16. After that, in step S17, the control unit 40 causes the mark detecting unit 36 and the driving device 37 of the placing table 130 to perform TV pre-alignment for the wafer W.

When the positional displacement amount is out of the threshold value in step S15 (No), the control unit 40 determines whether the number of repetitions has reached predetermined number in step S15r. When the number of repetitions has not reached the predetermined number (No), the control unit 40 causes the wafer W to be transferred out of the P/A unit 30, and repeats operation from step S11 again. When the number of repetitions has reached the predetermined number (Yes), the control unit 40 forcibly terminates the processing for the wafer W in step S16r, and the processing proceeds to step S18.

When the TV pre-alignment in step S17 is completed or when forced termination in step S16r is executed, the control unit 40 causes the transfer robot 21 or the like to transfer the wafer W out of the P/A unit 30 in step S18.

With the above-described procedures, the TV pre-alignment for the wafer W is finished in the exposure apparatus 1. The wafer W subject to the TV pre-alignment is transferred to the exposure unit 50 and subjected to exposure processing. The wafer W subject to the forced termination is, for example, ejected to the outside of the exposure apparatus 1.

Next, exemplary exposure processing as pattern forming processing will be described with reference to FIG. 9.

Figure 9:
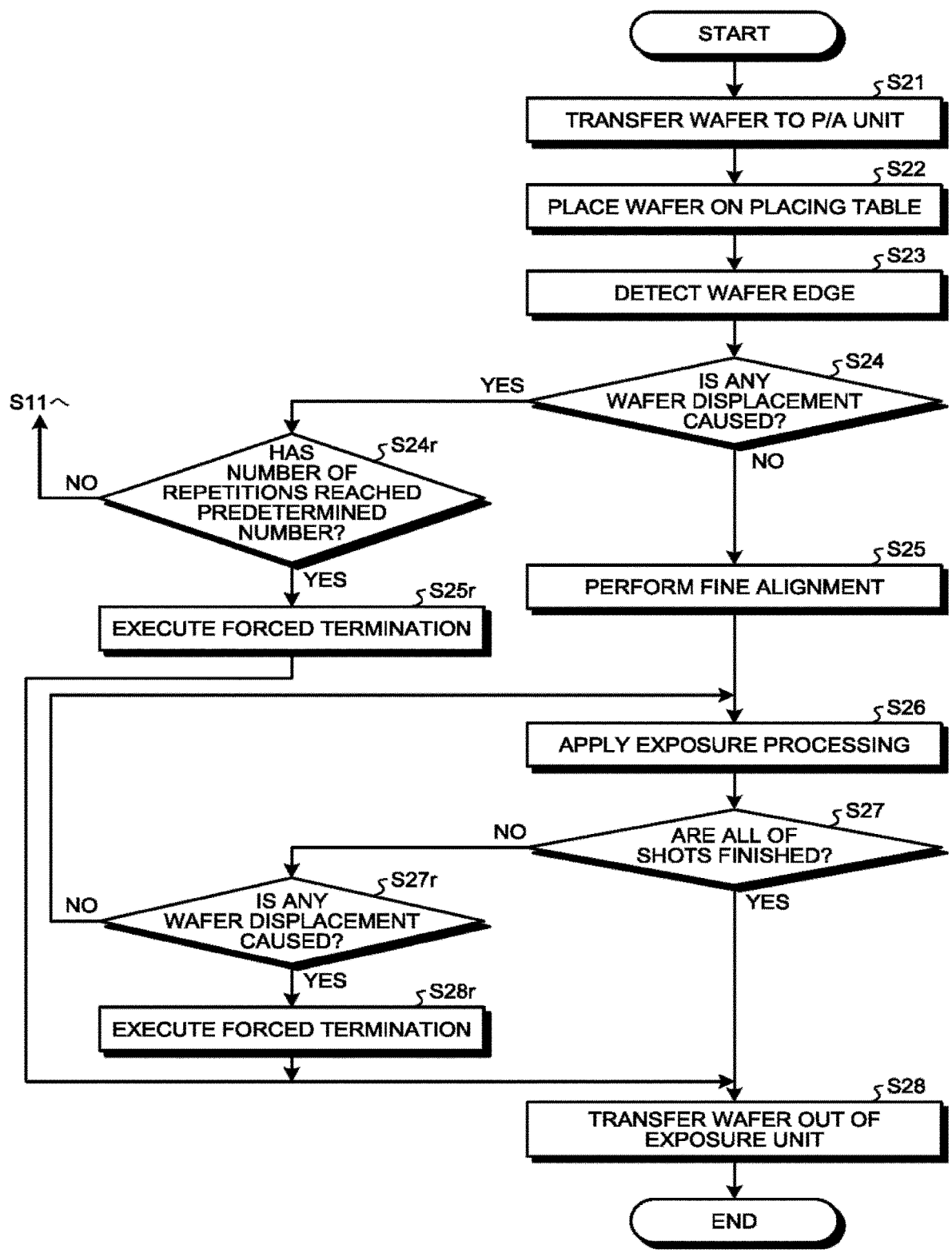
FIG. 9 is a flowchart illustrating exemplary procedures of exposure processing in the exposure apparatus according to the embodiment.

FIG. 9 is a flowchart illustrating exemplary procedures of the exposure processing in the exposure apparatus 1 according to the embodiment. Here, an example of adopting a step-and-scan system in the exposure processing will be described. In the flowchart of FIG. 9, for example, the control unit 40 operates each position detecting unit 60e from start of processing in step S21 to end of the processing in step S28.

As illustrated in FIG. 9, in step S21, the control unit 40 transfers a wafer W to the exposure unit 50 by the transfer robot 21. In step S22, the control unit 40 places the wafer W on the placing table 150 with the transfer robot 21, a plurality of pins, and the like.

In step S23, the control unit 40 refers to data of each position detecting unit 60e during a period from when transfer of the wafer W into the exposure unit 50 by the transfer robot 21 is started until the wafer W is placed on the placing table 150. In step S24, the control unit 40 calculates a positional displacement amount from the referred data of each position detecting unit 60e, and determines whether positional displacement of the wafer W is caused during this period. When there is no positional displacement (No), the control unit 40 performs fine alignment for the wafer W by the mark detecting unit 56, second interferometer 58, and second driving device 57 of the placing table 150 in step S25.

When positional displacement is caused in step S24 (Yes), the control unit 40 determines whether the number of repetitions has reached predetermined number in step S24r. When the number of repetitions has not reached the predetermined number (No), the control unit 40 causes the wafer W to be transferred out of the exposure unit 50, and repeats operation from step S11 again. When the number of repetitions has reached the predetermined number (Yes), the control unit 40 forcibly terminates the processing for the wafer W in step S25r, and the processing proceeds to step S28.

When the fine alignment in step S25 is finished, the control unit 40 controls the respective units of the exposure unit 50 performs exposure for resist of the wafer W in step S26. In step S27, the control unit 40 determines whether exposure is finished for all of shots on the wafer W.

When all of the shots are not yet finished in step S27 (No), the control unit 40 determines in step S27r whether positional displacement of the wafer W is caused after the most recent determination. When no positional displacement is caused (No), operation from step S26 is repeated. When positional displacement is caused (Yes), the control unit 40 forcibly terminates the processing for the wafer W in step S28r, and the processing proceeds to step S28.

When exposure is finished for all of the shots in step S27 (Yes), or when forced termination is executed in step S25r or step S28r, the control unit 40 causes the transfer robot 21 or the like to transfer the wafer W out of the exposure unit 50 in step S28.

With the above-described procedures, the exposure processing for the wafer W in the exposure apparatus 1 ends. The wafer W is ejected to the outside of the exposure apparatus 1.

Figure 10:
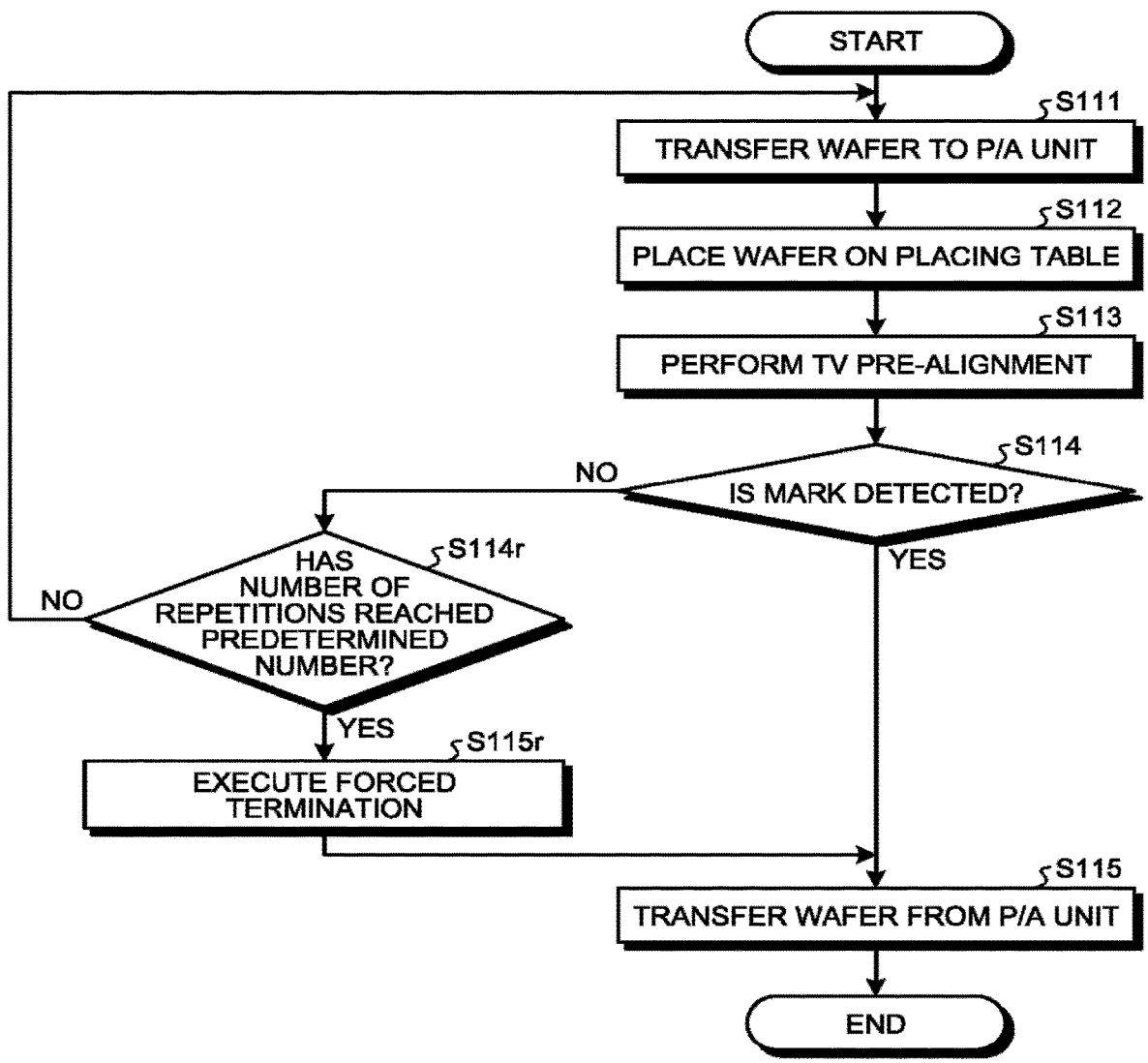
FIG. 10 is a flowchart illustrating exemplary procedures of TV pre-alignment in an exposure apparatus according to a comparative example.

Here, exposure processing in an exposure apparatus in a comparative example will be described with reference to FIG. 10 in order to describe effects of the exposure apparatus 1 of the embodiment. FIG. 10 is a flowchart illustrating exemplary procedures of TV pre-alignment in the exposure apparatus according to the comparative example.

As illustrated in FIG. 10, a wafer is transferred into a P/A unit in step S111 and the wafer is placed on a placing table in step S112 also in the exposure processing of the comparative example.

In the exposure processing of the comparative example, TV pre-alignment is performed in step S113, and whether a mark can be detected is determined in step S114. When a mark is detected (Yes), it is deemed that TV pre-alignment is completed and the wafer is transferred out of the P/A unit in step S115.

However, as described above, positional displacement may be caused during transfer of the wafer W. In this case, a mark may deviate from a field of view of a mark detecting unit. When no mark can be captured within the field of view, the mark detecting unit cannot automatically detect a mark.

Therefore, it is necessary to look for a mark while manually moving the placing table, and a long time may be required to detect a mark. In a case where a positional displacement amount is too large, a mark cannot be detected within a predetermined period, and timeout may be caused. In the event of timeout in step S114 (No), transfer of a wafer is repeated through step S114r. In this case, more time is consumed. As a result of thus wasting time, forced termination may be executed in step S115r.

In recent years, wafer warpage is likely to occur due to a semiconductor device having a multi-layer stacking structure. Additionally, a rear surface of a wafer may be changed to become slippy. Therefore, the above-described positional displacement of a wafer is likely to be caused, and a case where a wafer cannot pass TV pre-alignment in the exposure apparatus of the comparative example is increased. Furthermore, since no countermeasure is taken for wafer positional displacement during exposure processing in the exposure apparatus of the comparative example, a defect may be caused.

In the P/A unit 30 of the exposure apparatus 1 of the embodiment, an edge of a wafer W is detected by each position detecting unit 60p before TV pre-alignment, and the control unit 40 performs correction as necessary. Consequently, a mark Mk can be quickly detected in the TV pre-alignment. Additionally, since each position detecting unit 60p can perform relatively simple detection in a wide area, even when positional displacement amount exceeds a predetermined threshold value, not a long time is required for such determination. Therefore, it is possible to determine whether a position of a wafer W can be corrected before performing the TV pre-alignment that requires a long time for determination, and the time can be saved.

In the exposure unit 50 of the exposure apparatus 1 of the embodiment, an edge of a wafer W is detected by each position detecting unit 60e before fine alignment and during exposure processing, and in a case where positional displacement is caused, the control unit 40 stops the exposure processing. After that, the control unit 40 returns the wafer back to the P/A unit 30 or executes forced termination as necessary. Consequently, even when positional displacement of a wafer W is caused during transfer to the exposure unit 50 after TV pre-alignment, an appropriate countermeasure taken, and furthermore, the time can be saved.

Modified Examples

In the above-described embodiment, position detecting units 60p and 60e are, for example, imaging elements, but the configurations of the position detecting units 60p and 60e are not limited thereto.

Figure 11:
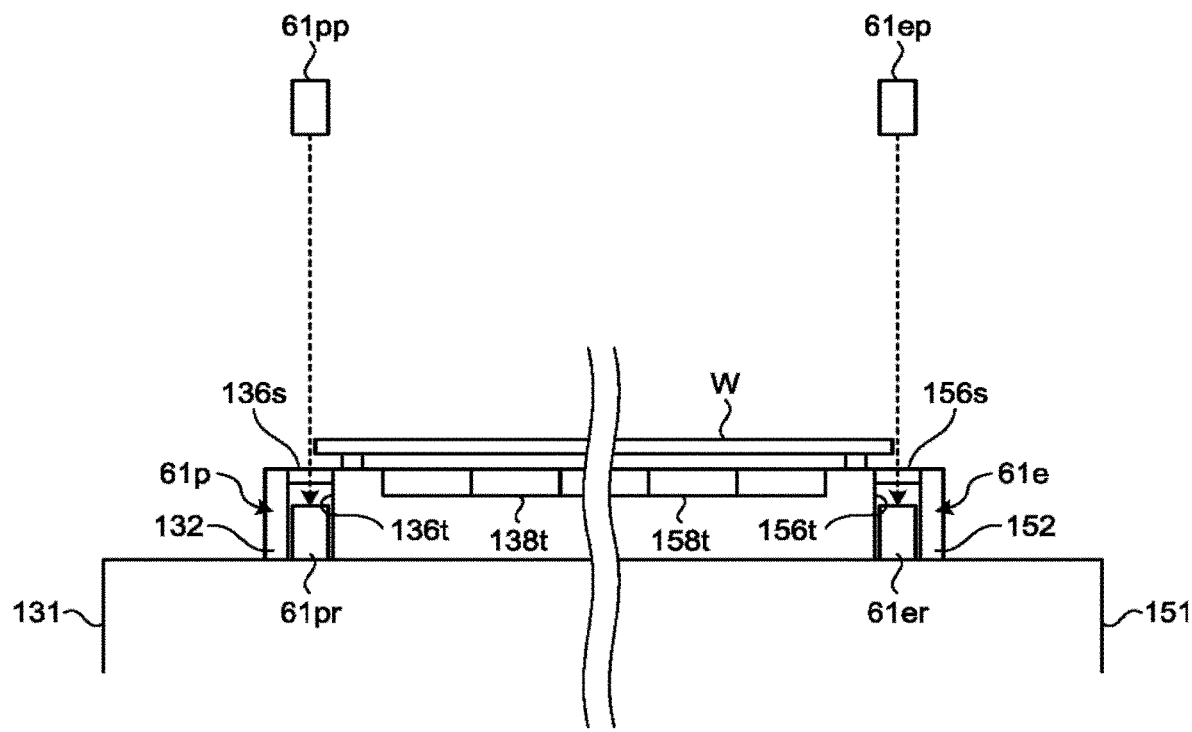
FIG. 11 is an exemplary configuration of a position detecting unit according to a modified example of the embodiment.

As illustrated in FIG. 11, for example, optical elements like photoelectric sensors may be used as position detecting units 61p and 61e. The position detecting unit 61p includes a light projecting unit 61pp and a light receiving unit 61pr. For example, the light projecting unit 61pp is provided above a wafer chuck 132 of a P/A unit 30, and the light receiving unit 61pr is provided inside a through hole 136t of the wafer chuck 132. The position detecting unit 61e includes a light projecting unit 61ep and a light receiving unit 61er. For example, the light projecting unit 61ep is provided above a wafer chuck 152 of an exposure unit 50, and the light receiving unit 61er is provided inside a through hole 156t of the wafer chuck 152. When the light emitted from the light projecting unit 61pp or 61ep is blocked by a wafer W, no light reaches the light receiving unit 61*pr* or 61*er*, and this phenomenon is sensed as positional displacement of the wafer W.

Figure 12:
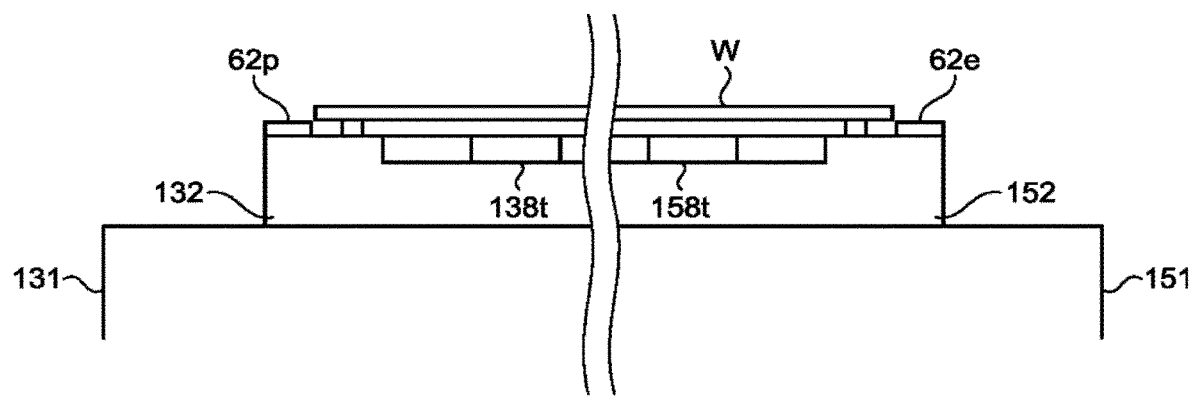
FIG. 12 is an exemplary configuration of a position detecting unit according to a modified example of the embodiment.

As illustrated in FIG. 12, for example, contact elements such as touch sensors may be used as position detecting units 62*p* and 62*e*. The position detecting unit 62*p* is provided, for example, on an upper surface of a wafer chuck 132 of a P/A unit 30. The position detecting unit 62*e* is provided, for example, on an upper surface of the wafer chuck 152 of the exposure unit 50.

Figure 13:
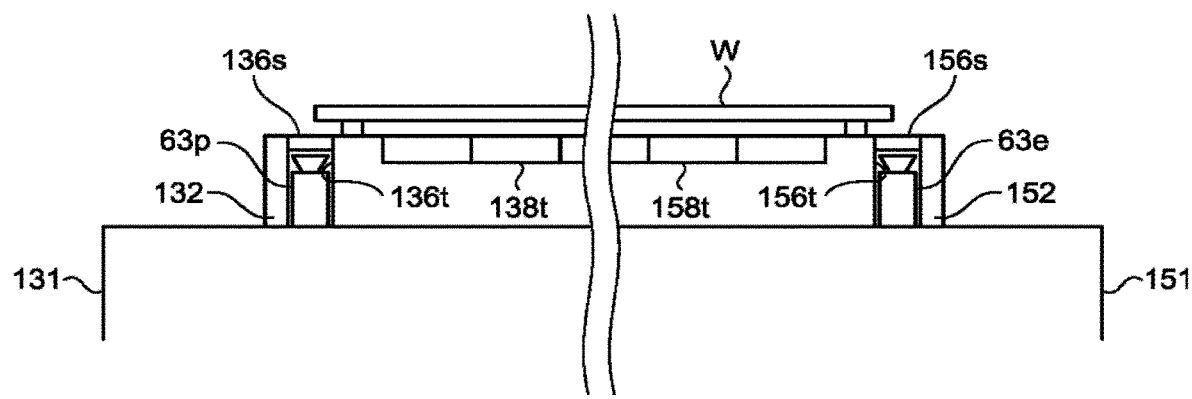
FIG. 13 is an exemplary configuration of a position detecting unit according to a modified example of the embodiment.

As illustrated in FIG. 13, for example, sound collecting elements such as microphones may be used as position detecting units 63*p* and 63*e*. The position detecting unit 63*p* is provided, for example, inside a through hole 136*t* of a wafer chuck 132 of a P/A unit 30. The position detecting unit 63*e* is provided, for example, inside a through hole 156*t* of a wafer chuck 152 of an exposure unit 50. According to such position detecting units 63*p* and 63*e*, it is possible to detect occurrence of positional displacement of a wafer W by detecting a sound indicating displacement of the wafer W even when a detailed positional displacement amount of the wafer W cannot be grasped.

Furthermore, for example, some of the position detecting units 60*p*, 61*p*, 62*p*, and 63*p* can be used in combination in the P/A unit 30. Also, for example, some of the position detecting units 60*e*, 61*e*, 62*e*, and 63*e* can be used in combination in the exposure unit 50.

Additionally, for example, any one of the position detecting units may be provided in only one of the P/A unit 30 and the exposure unit 50.

Furthermore, in the above-described exemplary configurations of the position detecting units 60*p* and 60*e*, the position detecting units 60*p* and 60*e* are provided at four positions in each of the wafer chucks 132 and 152, but the number of each of the position detecting units 60*p* and 60*e* is not limited thereto. A wafer W tends to be mainly displaced toward an advancing direction side of the transfer arm 21*a*. Therefore, for example, each of the position detecting units 60*p* and 60*e* may be provided only at one point on the transfer direction side. Additionally, when the number of installed position detecting units 60*p* and 60*e* is increased, detection accuracy is more improved, but even in a case where more than ten of each of the position detecting units 60*p* and 60*e* are provided, for example, further improvement of detection accuracy cannot be expected and this turns out to be an excessive configuration. Therefore, the number of each of the position detecting units 60*p* and 60*e* is, preferably, one or more and ten or less, more preferably, three or more and eight or less. Additionally, when a plurality of position detecting units 60*p* and a plurality of position detecting units 60*e* are provided, it is desirable that the respective position detecting units be arranged uniformly along an edge of a wafer W. Furthermore, the above-described number and arrangement of position detecting units can also be applied to other position detecting units 61*p*, 61*e*, 62*p*, 62*e*, 63*p*, and 63*e*.

Additionally, in the above embodiment, the step-and-scan system is adopted in the exposure apparatus 1, but a system other than the step-and-scan system may also be adopted.

Another Embodiment

Figure 14:
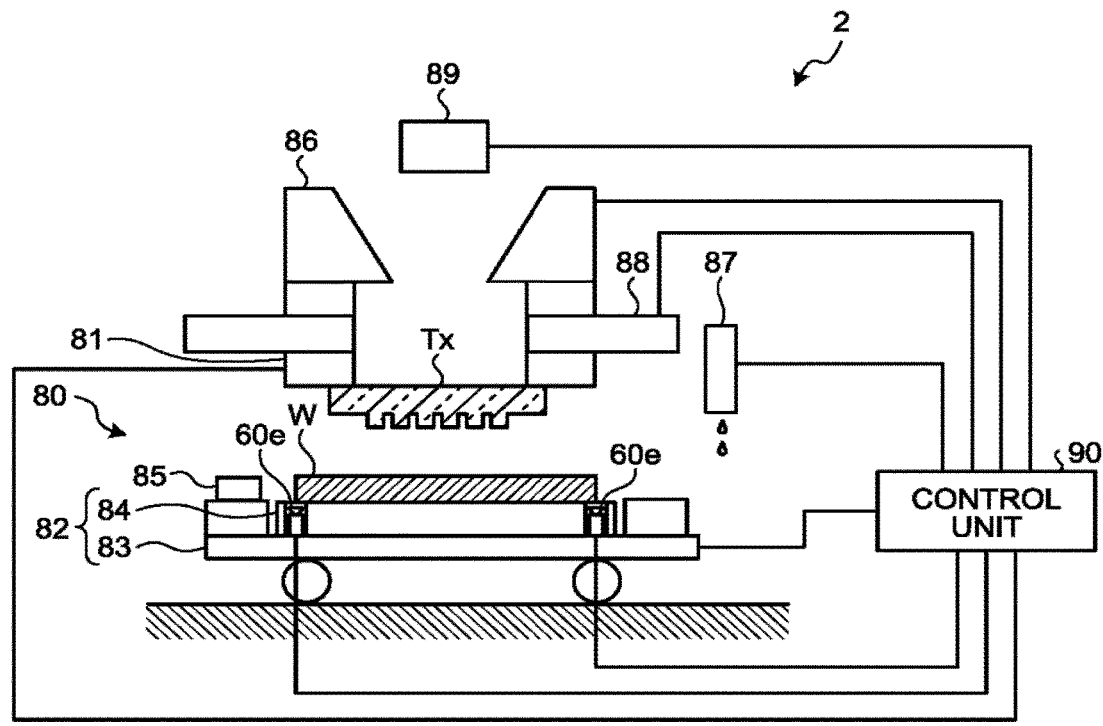
FIG. 14 is a diagram illustrating an exemplary configuration of an exposure unit of an imprint apparatus according to another embodiment.

A pattern forming apparatus according to another embodiment is, for example, an imprint apparatus in which a pattern is formed by pressing a template against resist applied to a wafer. An imprint apparatus 2 of another embodiment will be described with reference to FIG. 14. FIG. 14 is a diagram illustrating an exemplary configuration of an exposure unit 80 of the imprint apparatus 2 according to another embodiment.

As illustrated in FIG. 14, the exposure unit 80 serving as a processing unit of the imprint apparatus 2 includes a template stage 81, a placing table 82, a reference mark 85, an alignment sensor 86, a liquid dropping device 87, a stage base 88, a light source 89, a position detecting unit 60*e*, and a control unit 90.

The placing table 82 includes a wafer chuck 84 and a main body 83. The wafer chuck 84 fixes a wafer W to a predetermined position on the main body 83. The wafer chuck 64 is provided with a position detecting unit 60*e* that detects an edge of a wafer W. The reference mark 85 is provided on the placing table 82. The reference mark 85 is used in positioning at the time of loading a wafer W on the placing table 82.

The placing table 82 is adapted to place a wafer W and is moved within a plane (in a horizontal plane) parallel to the placed wafer W. The placing table 82 moves the wafer W to a lower side of the liquid dropping device 87 at the time of dropping the resist onto the wafer W, and the placing table 82 moves the wafer W to a lower side of a template Tx at the time of performing transfer processing to the wafer W.

The template Tx is a master used for nanoimprint lithography and the like. A template pattern is three-dimensionally formed on a lower surface side of the template Tx.

The stage base 88 supports the template Tx by the template stage 81 and presses the template pattern of the template Tx against the resist on the wafer W by moving the template Tx in an up-down direction (vertical direction). The alignment sensor 86 is provided on the stage base 88. The alignment sensor 86 is a sensor to detect a position of the wafer W and detects a position of the template Tx.

The liquid dropping device 87 is a device to drop the resist onto a wafer W by an inkjet system. An inkjet head included in the liquid dropping device 87 has a plurality of fine holes from which droplets of the resist are jetted, and drops a dot-like resist onto the wafer W.

The light source 89 is, for example, a device to emit ultraviolet rays, and is provided above the stage base 88. The light source 89 emits light from above the template Tx in a state where the template Tx is pressed against the resist.

The control unit 90 controls the template stage 81, placing table 82, reference mark 85, alignment sensor 86, liquid dropping device 87, stage base 88, light source 89, and position detecting unit 60*e*.

In the imprint processing as the pattern forming processing in the imprint apparatus 2 having the above-described configuration, for example, in the exposure unit 80, the template Tx is pressed against the resist and the resist is charged into a recess of the template Tx, and then ultraviolet rays are emitted to cure the resist, and after that, the template Tx is demolded.

In this imprint apparatus 2 also, an edge of a wafer W is detected by using a position detecting unit 60*e* when a wafer W is transferred to the exposure unit 80 and during exposure processing, and positional displacement is corrected. Consequently, a time for alignment inside the exposure unit 80 can be shortened.

Additionally, in this imprint apparatus 2 also, other position detecting units 61*e*, 62*e*, and 63*e* can be used instead of or in addition to the position detecting unit 60*e*.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming apparatus comprising:
a processing unit that applies processing to a substrate having a mark provided on a front surface of the substrate;
a transfer unit that transfers the substrate into the processing unit;
a placing table on which the substrate transferred into the processing unit is placed;
a first imaging element that is provided at a position included in the placing table and overlapping with an edge of the substrate, and captures an image of the substrate from a back side of the substrate to detect a position of the edge of the substrate;
a second imaging element that captures an image of the mark of the substrate on the placing table from a front side of the substrate to detect a position of the mark; and
a control unit that calculates, before performing alignment of the position of the substrate with the position of the mark detected by the second imaging element, a positional displacement amount of the substrate from the position of the edge of the substrate detected by the first imaging element, and controls the placing table based on the positional displacement amount of the substrate to correct the position of the substrate.

2. The pattern forming apparatus according to claim 1, wherein the first imaging element detects the position of the edge of the substrate during a period from when transfer of the substrate into the processing unit is started until processing on the substrate is completed.

3. A pattern forming apparatus comprising:
a processing unit that applies processing to a substrate having a mark provided on a front surface of the substrate;
a transfer unit that transfers the substrate into the processing unit;
a placing table on which the substrate transferred into the processing unit is placed;
a first imaging element that is provided at a position included in the placing table and overlapping with an edge of the substrate, and captures an image of the substrate from a back side of the substrate to detect a position of the edge of the substrate;
a second imaging element that captures an image of the mark of the substrate on the placing table from a front side of the substrate to detect a position of the mark; and
a control unit that determines, before performing alignment of the position of the substrate with the position of the mark detected by the second imaging element whether positional displacement of the substrate is caused from the position of the edge of the substrate detected by the first imaging element, and suspends processing in the processing unit when positional displacement of the substrate is caused.

4. The pattern forming apparatus according to claim 3, wherein the control unit calculates a positional displacement amount of the substrate from the position of the edge of the substrate detected by the first imaging element unit when positional displacement of the substrate is caused before suspending processing in the processing unit, and controls the placing table based on the positional displacement amount of the substrate to correct the position of the substrate.

5. The pattern forming apparatus according to claim 3, wherein the first imaging element detects the position of the edge of the substrate during a period from when transfer of the substrate into the processing unit is started until processing on the substrate is completed.

6. A manufacturing method for a semiconductor device executed by a pattern forming apparatus that forms a pattern on a substrate having a mark provided on a front surface of the substrate, the manufacturing method comprising:
preparing the substrate;
transferring the substrate into a processing unit, and processing the substrate;
placing the substrate on a placing table inside the processing unit;
capturing an image of the mark of the substrate on the placing table from a front side of the substrate to detect a position of the mark, and performing alignment of the position of the substrate with the position of the mark detected;
before performing the alignment, capturing an image of the substrate from a back side of the substrate to detect a position of an edge of the substrate, calculating a positional displacement amount of the substrate from detection data, and determining whether positional displacement of the substrate is caused;
determining whether the positional displacement amount is within a predetermined threshold value in a case where the positional displacement of the substrate is caused;
correcting the positional displacement of the substrate based on the positional displacement amount in a case where the positional displacement of the substrate is caused and the positional displacement amount is within the predetermined threshold value.

7. The manufacturing method for the semiconductor device according to claim 6, wherein the position of the edge of the substrate is detected during a period from when transfer of the substrate into the processing unit is started until the processing on the substrate is completed.

8. A manufacturing method for a semiconductor device executed by a pattern forming apparatus that forms a pattern on a substrate having a mark provided on a front surface of the substrate, the manufacturing method comprising:
preparing the substrate,
transferring the substrate into a processing unit and processing the substrate;
capturing an image of the mark of the substrate from a front side of the substrate to detect a position of the mark, and performing alignment of the position of the substrate with the position of the mark detected;
before performing the alignment, capturing an image of the substrate from a back side of the substrate and placing the substrate on a placing table inside the processing unit;
detecting a position of an edge of the substrate, calculating a positional displacement amount of the substrate from detection data, and determining whether positional displacement of the substrate is caused; and
stopping the processing inside the processing unit in a case where positional displacement of the substrate is caused.

9. The manufacturing method for the semiconductor device according to claim 8, further comprising, when positional displacement of the substrate is caused:
   before suspending processing in the processing unit, determining whether the positional displacement amount is within a predetermined threshold value; and
   correcting positional displacement of the substrate based on the positional displacement amount in a case where the positional displacement amount is within the predetermined threshold value.

10. The manufacturing method for the semiconductor device according to claim 8, wherein the position of the edge of the substrate is detected during a period from when transfer of the substrate into the processing unit is started until the processing on the substrate is completed.

11. The pattern forming apparatus according to claim 1, wherein
   the alignment is pre-alignment in which rough alignment is performed, and
   the processing unit is a pre-alignment unit that performs the pre-alignment for the substrate.

12. The pattern forming apparatus according to claim 1, wherein
   the alignment is fine alignment in which precise fine alignment is performed, and
   the processing unit is an exposure unit that performs exposure processing on resist on the substrate through a master.

13. The pattern forming apparatus according to claim 12, wherein
   the control unit suspends the processing in the processing unit when positional displacement of the substrate is caused during the exposure processing.

14. The pattern forming apparatus according to claim 3, wherein
   the alignment is pre-alignment in which rough alignment is performed, and
   the processing unit is a pre-alignment unit that performs the pre-alignment for the substrate.

15. The pattern forming apparatus according to claim 3, wherein
   the alignment is fine alignment in which precise fine alignment is performed, and
   the processing unit is an exposure unit that performs exposure processing on resist on the substrate through a master.

16. The manufacturing method for the semiconductor device according to claim 6, wherein
   the alignment is pre-alignment in which rough alignment is performed, and
   the processing unit is a pre-alignment unit that performs the pre-alignment for the substrate.

17. The manufacturing method for the semiconductor device according to claim 6, wherein
   the alignment is fine alignment in which precise fine alignment is performed, and
   the processing unit is an exposure unit that performs exposure processing on resist on the substrate through a master.

18. The pattern forming apparatus according to claim 17, the method further comprising
   suspending the processing in the processing unit when positional displacement of the substrate is caused during the exposure processing.

19. The manufacturing method for the semiconductor device according to claim 8, wherein
   the alignment is pre-alignment in which rough alignment is performed, and
   the processing unit is a pre-alignment unit that performs the pre-alignment for the substrate.

20. The manufacturing method for the semiconductor device according to claim 8, wherein
   the alignment is fine alignment in which precise fine alignment is performed, and
   the processing unit is an exposure unit that performs exposure processing on resist on the substrate through a master.

* * * * *